United States Patent [19]
Aubert et al.

[11] Patent Number: 4,962,504
[45] Date of Patent: Oct. 9, 1990

[54] MIXED LANTHANIDE-MAGNESIUM ALUMINATES AND LASERS USING MONOCRYSTALS OF THESE ALUMINATES

[75] Inventors: Jean-Jacques Aubert, Le Fontanil-Cornillon; Anne-Marie Lejus, Montrouge; Bruno Viana, Mandres-Les-Roses; Daniel Vivien, Garches, all of France

[73] Assignees: Centre National de la Recherche Scientifique, Tole; Commissariat a l'Energie Atomique, Paris, both of France

[21] Appl. No.: 336,748

[22] Filed: Apr. 12, 1989

Related U.S. Application Data

[62] Division of Ser. No. 62,882, Jun. 16, 1986.

[30] Foreign Application Priority Data

Jun. 16, 1986 [FR] France ............................. 89 08660

[51] Int. Cl.$^5$ ................................ H01S 3/16
[52] U.S. Cl. ............................. 372/41; 252/301.4 R
[58] Field of Search ............................. 322/39, 41; 252/301.4 R

[56] References Cited

U.S. PATENT DOCUMENTS 4,606,846  8/1986  Kahn et al. ................. 252/301.4 R
4,664,849  5/1987  Farrington et al. ......... 252/301.4 R

OTHER PUBLICATIONS

Kahn et al., "Preparation, Structure, Optical, and Magnetic Properties of Lanthanide Aluminate Single Crystals ($LnMAl_{11}O_{19}$)"; Jour. of Appl. Phys. 52 (11), Nov., 1981.

*Primary Examiner*—Leon Scott, Jr.
*Attorney, Agent, or Firm*—Michael N. Meller

[57] ABSTRACT

Mixed lanthanide-magnesium aluminates and lasers using monocrystals of these aluminates. These lasers in particular incorporate two flash lamps for longitudinally pumping a monocrystalline rod of a magneto-plumbito-aluminate emitting visible or infrared light, amplified between a mirror, a polarizing prism being used for passing to the outside of the laser the amplified light beam. The aluminate is of formula: $(La_{1-x}Tr_x)_{1-y-v}Mg_{1-z-t}Al_{11-u+y+2z/3}Cr_uO_{19-t-3v/3}$ in which Tr represents (a) at least one single trivalent substance chosen from among lanthanides, $Y^{3+}$, $Sc^{3+}$, or (b) at least one pair of lanthanides formed from a divalent element and a trivalent element, while retaining the electrical neutrality by adding aluminum or oxygen deficiencies, or any combination of (a) and (b); x is a number such that $0 \leq x < 1$; y and v are numbers such that $0 \leq y+v \leq 0.4$; z and t are numbers such that $0 \leq z+t < 1$, provided that when $z=t=0$, $y+v$ is $\neq 0$ for Tr representing a single trivalent lanthanide; u is a number between 0 and 2, provided that when Tr represents $Y^{3+}$ or $Sc^{3+}$ u is $\neq 0$, that when $x=0$ u is $\neq 0$ and that when $u=0$ x is $\neq 0$.

12 Claims, 1 Drawing Sheet

MIXED LANTHANIDE-MAGNESIUM ALUMINATES AND LASERS USING MONOCRYSTALS OF THESE ALUMINATES

This is a division of application Ser. No. 062,882, filed June 16, 1986.

BACKGROUND OF THE INVENTION

The present invention relates to mixed lanthanid-magnesium aluminates obtained in the form of monocrystals and having applications in the field of microlasers for integrated optics, optical fibre telecommunications or medicine (microsurgery, skin treatment), in the field of power lasers emitting in the infrared or visible ranges with a certain degree of tunability and power lasers tunable in the visible range more particularly making it possible to carry out treatments of materials (welding, drilling, marking, surface treatment), photochemical reactions, controlled thermonuclear fusion or polarization of the atoms of a gas, such as helium.

Certain lasers according to the invention emit at wavelengths of 1054, 1082 and 1320 nm with a certain degree of tunability, whereas other lasers emit in the range 1.5 to 3 micrometers and yet other lasers with tunability between 680 and 800 nm. Known mixed lanthanide-magnesium aluminates are in particular lanthanum-neodymium-magnesium aluminates, called LNA and of formula $La_{1-x}Nd_xMgAl_{11}O_{19}$ with $0 < x \leq 1$ and preferably of formula $La_{0.9}Nd_{0.1}MgAl_{11}O_{19}$. These mixed aluminates are in particular referred to in FR-A-2 448 134 and EP-A-0 043 776 filed in the name of the present Applicants. These mixed aluminates obtained in monocrystalline form have laser properties comparable to those of neodymium-doped aluminium and yttrium garnet, known under the abbreviation YAG:Nd and neodymium ultraphosphate ($NdP_5O_{14}$) emitting in the infrared.

In particular, LNA has very interesting laser emission wavelengths at 1054 and 1082 nm covering that of YAG at 1064 nm. It also has another emission wavelength at range around 1320 nm, which corresponds to the smallest attenuation by silica optical fibres, which thus permits the transmission of maximum information with minimum loss. LNA monocrystals can be obtained by a large number of crystallogenesis methods using a molten bath, such as the Verneuil or the Czochralski method, in order to obtain the laser effect.

However, these aluminates do not have so-called congruent fusion or melting, i.e. the monocrystal does not have the same composition as the molten bath. Thus, the production of monocrystals of these aluminates and particularly by the most widely used Czochralski method, leads to crystals having an inadequate quality (bubbles, defects), as soon as it is necessary to achieve the large sizes required by the laser industry and particularly in connection with power lasers (bar/rod of 6.35 mm diameter and 100 nm long). Moreover, LNA has only a small number of laser emission wavelengths.

Furthermore, mixed lanthanum-neodymium-magnesium aluminates are known of formula $La_{1-x}Nd_x\cdot Mg_yAl_{11}O_{18+y}$, in which x and y represent numbers such that $0 < x < 0.2$ and $0 < y < 1$, preferably with $0.4 < y < 0.7$. These mixed aluminates in particular form the subject matter of French patent application No. 8515579, filed on behalf of the Applicants on Oct. 21, 1985. These mixed aluminates lead to an improvement compared with LNA with regards to the production of large monocrystals. However, the wavelength range covered by these lasers is still limited.

SUMMARY OF THE INVENTION

The invention specifically relates to novel mixed lanthanide-magnesium aluminates produced in the form of large monocrystals and consequently usable in the power laser industry, in the case of lasers emitting with a wavelength range from the yellow to the infrared (3 micrometers).

According to the main feature of the invention, these mixed lanthanide-magnesium aluminates are characterized in that they are of the following formula I: $(La_{1-x}Tr_x)_{1-y-v}Mg_{1-z-t}Al_{11-u+y+2z/3}Cr_uO_{19-t-3v/2}$ in which Tr represents (a) at least one single trivalent substance chosen from among lanthanides, yttrium and scandium, or (b) at least one pair of lanthanides formed from a divalent element and a trivalent element with retention of the electrical neutrality by adding aluminium or oxygen vacancies, or any combination of said single substances and pairs; x represents a number such that $0 \leq x < 1$; y and v representing numbers such that $0 \leq y + v \leq 0.4$; z and t represent numbers such that $0 \leq x + t < 1$, provided that when $z + t = 0$, $y + v$ is $\neq 0$ or Tr representing a single trivalent lanthanide; u is a number between 0 and 2, provided that when Tr represents $Y^{3+}$ or $Sc^{3+}$ u is $\neq 0$, when $x = 0$ u is $\neq 0$ and when $u = 0$ x is $\neq 0$. In addition, these mixed aluminates are monophase and have a crystalline structure of the magnetoplumbite type and with a hexagonal mesh. In particular, they have mechanical properties similar of to those of alumina.

According to the invention, these aluminates can be used as laser emitters in a wide wavelength range, the latter being dependent on the nature of Tr and the presence or absence of chromium. Moreover, a large number of these aluminates has a so-called congruent melting and the crystals produced by the Czochralski method are of good quality. It then becomes possible to prepare large monocrystals, as required by the power laser industry.

Furthermore, during the growth of the monocrystal, these mixed aluminates exhibit an absence of segregation of the constituents making it possible to increase the monocrystal pulling rate compared with that of LNA. This leads to a significant gain with regards to the preparation time of the monocrystals, as well as the life of the crucibles containing the molten bath from which pulling takes place.

In formula I, for $x \neq 0$, Tr is e.g. chosen from among neodymium, praseodymium, erbium, holmium, thulium, divalent neodymium-europium pairs, divalent praseodymium-europium and the pairs praseodymium-samarium, praseodymium-dysprosium, praseodymium-thulium, A-neodymium, A-praseodymium, A-erbium, A-holmium, A-thulium with A representing an element chosen from among yttrium, scandium, lutetium, cerium and gadolinium.

Preferably Tr is chosen from among neodymium, praseodymium, erbium, holmium, thulium, the pairs of divalent neodymium-europium, divalent praseodymium-europium, cerium-neodymium, cerium-praseodymium, praseodymium-samarium, praseodymium-dysprosium, praseodymium-thulium, cerium-erbium and cerium-holmium.

When in formula I, x is equal to 0 and consequently u is non-zero, the corresponding mixed aluminates produced in the form of monocrystals can be used as a continuous or pulsed laser emitting in the visible and near infrared with tunability between 680 and 800 nm, the laser emission being due to the chromium.

At present, only chromium-doped alexandrite of formula $BeAl_2O_4:Cr^{3+}$, emitting between 680 and 800 nm, has a real industrial importance for vibronic lasers. The latter are tunable lasers in which the energy levels responsible for the laser effect are excited vibrational levels of the fundamental electronic state.

When Tr represents praseodymium or a D-praseodymium pair, in which D represents an element chosen from among yttrium, scandium, lutetium, cerium, samarium, dysprosium, thulium in the trivalent state or europium in the divalent state with $x \neq 0$, the corresponding mixed aluminates according to the invention, produced in monocrystalline form, can be used as a laser emitter emitting in the visible and mainly in the yellow and red. These aluminates, whose luminescence is due to praseodymium are more particularly usable in continuous or pulsed power lasers. The term power laser is understood to mean a laser emitting a light beam of at least several watts.

When in formula I, Tr represents neodymium or the E-neodymium pair, with E representing yttrium, scandium, lutetium, cerium in the III oxidation state or europium in the II oxidation state with $x \neq 0$, the corresponding mixed aluminates, produced in the form of monocrystals, can be used as a laser emitter, particularly in power lasers, emitting in the infrared and in particular at 1054, 1082 or 1320 nm, like LNA. The laser emission is due to the neodymium in these aluminates.

When in formula I, Tr represents holmium or the G-holmium pair, with G representing yttrium, scandium, lutetium or cerium with $x \neq 0$, the corresponding mixed aluminates, produced in the form of monocrystals, can be used as laser emitters and in particular in power lasers emitting in the infrared and more especially at wavelengths between 1500 and 3000 nm.

The wavelengths around 3000 nm have the advantage of being absorbed by water. Moreover, in the vicinity of 1.5 micrometer, the eye is no longer sensitive to laser emission, which offers safety to the eye.

Other wavelengths can be emitted when Tr represents erbium or thulium taken singly or combined with cerium, yttrium, scandium or lutetium, or any other rare earth. With erbium, the laser emissions are in particular in the infrared.

It is known that the laser effect is dependent on certain parameters and in particular the life of the excited state of $E_1$ of the ions responsible for the laser effect. If the life of said excited state is high, the population inversion, corresponding to a number of ions in the excited state exceeding the number of ions in the normal state can take place. The possible transitions between the excited state $E_1$ and lower energy levels for neodymium, praseodymium, holmium, thulium, erbium and chromium are more particularly described in an article in Phys. Status Sol. (a) 87, 11, 1985 and entitled "Achievements in the field of Physics and Spectroscopy of Activated Laser Crystals" by A. Kaminskii.

Research has shown that the more lanthanum contained in the mixed compound according to the invention, the longer the life of excited state $E_1$. However, the intensity of the fluorescence increases with the concentration of luminescent ions. However, an excessive luminescent ion quantity aids interaction between these ions, which are prejudicial to fluorescence.

In order to bring about the population of the exited state $E_1$, the luminescent ions are excited up to an energy level $E_2$ exceeding the excited state $E_1$. The population of state $E_2$ is obtained by light absorption or optical pumping. As energy level $E_2$ is very unstable, the luminescent ions are spontaneously de-excited to energy state $E_1$.

As the absorption peaks of lanthanides and in particular neodymium are very narrow, the partial substitution of the aluminium by chromium aids the light absorption by the aluminate. Thus, chromium has wide absorption bands in the visible range, namely a first band from 400 to 500 nm and a second band from 600 to 700 nm.

After being brought into the excited state by light absorption in one or other of these spectral bands, the chromium transfers its energy to the neodymium ions, thus permitting the population of energy level $E_1$. This energy transmission is possible because the energy difference between the normal state and the excited state of the chromium ions is close to the energy difference between the normal state and the super-excited state $E_2$ of the neodymium ions.

Optical pumping in aluminates containing praseodymium can be aided by substituting part of the luminescent atoms by samarium, disprosium, thulium, trivalent cerium or divalent europium. Thus, certain of these elements have absorption bands which are as wide as those of chromium (the width of the absorption bands of these lanthanides and chromium being linked with the nature of their transitions from a level D to a level F). Moreover, all these elements satisfy the resonance rule between certain fluorescence transitions and the absorption of praseodymium.

These elements (lanthanides or chromium) are called laser emission sensitizers, whereas the luminescent ions responsible for the laser effect are called laser activators. The sensitizer and activator are chosen as a function of the wavelength used for optical pumping and the desired transmission wavelength. In the case of neodymium, cerium-chromium codoping can be envisaged. In the absence of a rare earths other than lanthanum, yttrium or scandium, chromium serves as the activator.

The partial substitution of the aluminium by chromium and/or the partial substitution of luminescent atoms by cerium, dysprosium, thulium and samarium in trivalent form, or europium in divalent form, as a function of the activator type, makes it possible to considerably increase the efficiency of the lasers using aluminate monocrystals according to the invention.

In view of the fact that the life of the excited state $E_1$ decreases when the quantity of luminescent ions increases and conversely the fluorescence intensity increases when the luminescent ion quantity increases, the monocrystals for which x is low, e.g. close to 0.1 for neodymium, are particularly adapted to the production of power lasers operating continuously, whereas monocrystals for which x is higher, e.g. $0.2 \leq x \leq 0.5$ for neodymium, are more suitable for the production of pulsed power lasers.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
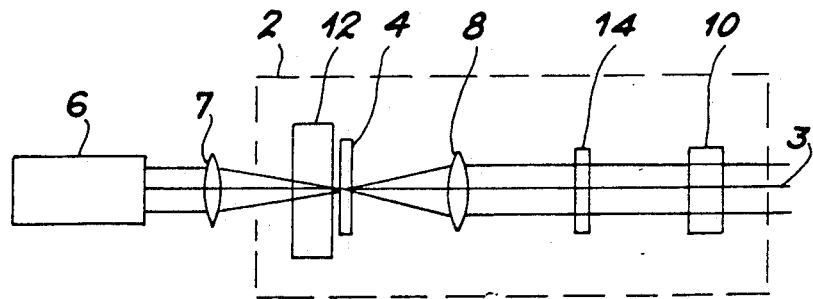
FIG. 1, diagrammatically a continuous laser using an aluminate monocrystal according to the invention.

A description will be given hereinafter of the production of mixed lanthanide-magnesium aluminates according to the invention and complying with formula I. These aluminates are obtained by intimately mixing in the requisite proportions, the high purity commercially available powders of oxides of lanthanum, TR, magnesium, aluminium and chromium, following by the calcining of the mixture obtained at a temperature of approximately 1500° C. After grinding the resulting product, a powder is obtained, which can be treated with a view to producing a monocrystal.

The aluminate powders can also be obtained by coprecipitation in the amorphous state of hydroxides of lanthanum, Tr, magnesium, aluminium and chromium. This coprecipitation is carried out with ammonia in an aqueous or non-aqueous solution such as absolute alcohol containing a mixture of nitrate or chloride of different metallic elements of the aluminate. Magnesium, aluminium and chromium chlorides or nitrates are commercially available, whereas the other nitrates or chlorides are obtained by dissolving the corresponding oxide respectively in nitric or hydrochloric acid.

The mixture obtained is then treated at 400° C. in a ventilated atmosphere up to its dehydration and the complete elimination of the ammonium chloride or nitrate, followed by calcining at a temperature of 1500° C. The powder obtained after grinding can then be treated with a view to producing a monocrystal.

The pulverulant oxides of the different elements used have a grain size between 1 and 10 micrometers and a purity exceeding 99.99%, in order to obtain a maximum efficiency for laser emission.

Preferably, the monocrystals of the aluminates according to the invention are produced by Czochralski pulling. However, any other crystallogenesis method using a molten bath can be used, such as e.g. the floating zone method, the Bridgmann method, the Verneuil method, the Kyropoulos method or the auto-crucible method, which may or may not be modified. For example, hereinafter a description of the obtaining of a monocrystal will be described, which is obtained from an aluminate according to the invention by the well known Czochralski pulling method.

The mixed aluminate powder obtained by coprecipitation or intimate mixing and heat treatment, as described hereinbefore, is, after grinding, placed in a iridium crucible, then raised to a melting point equal to 1810° C., protected from the air in such a way as to form a molten bath.

A monocrystalline nucleus of the same composition as the molten bath and cut parallel, namely to the crystallographic direction c, or the direction a of the hexagonal mesh of the compound, is then brought into contact with the liquid bath and then slowly raised, whilst rotating on itself. The monocrystal is thus progressively formed at the end of the nucleus in the direction imposed by the latter. This process made it possible to produce a large number of aluminate monocrystals having large dimensions and having a laser effect.

In particular, it made it possible to produce monocrystals of formula (a) $La_{1-x}Tr_xMg_{1-t}Al_{11}O_{19-t}$ in which Tr represents praseodymium, holmium, erbium, thulium, the cerium-neodymium, cerium-praseodymium, cerium-holmium, cerium-erbium, praseodymium-samarium, praseodymium-disprosium or praseodymium-thulium pairs.

In these aluminates, corresponding to $c=y=u=z=0$ in formula I, the magnesium deficite is compensated by oxygen vacancies. Examples of aluminates according to the invention and complying with formula (a), produced in the form of monocrystals, are given hereinafter:

$La_{0.95}Pr_{0.05}Mg_{0.75}Al_{11}O_{18.75}$ $La_{0.95}Ho_{0.05}Mg_{0.75}Al_{11}O_{18.75}$ $La_{0.95}Er_{0.05}Mg_{0.75}Al_{11}O_{18.75}$ $La_{0.95}Tm_{0.05}Mg_{0.75}Al_{11}O_{18.75}$ $La_{0.90}Ce_{0.005}Nd_{0.095}Mg_{0.5}Al_{11}O_{18.5}$ $La_{0.90}Ce_{0.005}Ho_{0.095}Mg_{0.75}Al_{11}O_{18.75}$ $La_{0.95}Ce_{0.0025}Er_{0.0025}Mg_{0.75}Al_{11}O_{18.75}$ $La_{0.80}Pr_{0.15}Sm_{0.05}Mg_{0.75}Al_{11}O_{18.75}$ $La_{0.90}Pr_{0.05}Sm_{0.05}Mg_{0.75}Al_{11}O_{18.75}$ $La_{0.90}Pr_{0.05}Dy_{0.05}Mg_{0.05}Al_{11}O_{18.75}$ $La_{0.83}Pr_{0.15}Dy_{0.02}Mg_{0.75}Al_{11}O_{18.75}$ $La_{0.73}Pr_{0.25}Tm_{0.02}Mg_{0.75}Al_{11}O_{18.75}$ $La_{0.90}Pr_{0.08}Tm_{0.02}Mg_{0.75}Al_{11}O_{18.75}$.

Aluminates according to the invention were also produced in the form of monocrystals with laser properties in accordance with formula (b) $La_{1-x}Tr_xMg_{1-z}Al_{11+2z/3}O_{19}$ in which Tr represents praseodymium, as well as cerium-neodymium, divalent praseodymium-europium and divalent neodymium-europium pairs.

In these aluminates, corresponding to $y=v=t=u=o$ in formula I, the magnesium deficit is compensated by an aluminium excess. In the same way, the retension of the electrical neutrality when using the pairs, $Pr^{3+}$-$Eu^{2+}$ or $Nd^{3+}$-$Eu^{2+}$ is assured by adding an aluminium quantity equal to ⅓ of $[Eu^{2+}]$.

Examples of aluminates satisfying formula (b) and produced in the form of monocrystals are:

$La_{0.95}Pr_{0.05}Mg_{0.5}Al_{11.333}O_{19}$ $La_{0.90}Ce_{0.005}Nd_{0.095}Mg_{0.5}Al_{11.333}O_{19}$ $La_{0.90}Pr_{0.095}Eu^2{}_{0.005}Mg_{0.75}Al_{11.168}O_{19}$ $La_{0.90}Nd_{0.095}Eu^{2+}{}_{0.005}Mg_{0.75}Al_{11.168}O_{19}$.

Aluminate monocrystals having a laser effect and satisfying formula (c) $(La_{1-x}Tr_x)_{1-v}Mg_{1-t}Al_{11}O_{19-t-3v/2}$ with Tr representing more particularly neodymium were also produced. In these aluminates, corresponding in formula I to $y=z=u=0$, the lanthanide and magnesium deficit is compensated by oxygen vacancies. Examples of aluminates according to formula (c) are the following compounds:

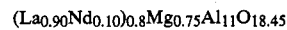

$(La_{0.90}Nd_{0.10})_{0.8}Mg_{0.75}Al_{11}O_{18.45}$ $(La_{0.90}Nd_{0.10})_{0.8}Mg_{0.8}Al_{11}O_{18.5}$.

As other monocrystals having a laser effect, production took place of aluminates satisfying formula (d) $(La_{1-x}Tr_x)_{1-y}Mg_{1-z}Al_{11+y+2z/3}O_{19}$ in which Tr represents more particularly neodymium or praseodymium. In the case of neodymium x advantageously varies from 0.1 to 0.5 (including boundaries) and y can assume all values from 0 to 0.4, whilst z is preferably between 0.045 and 1. In these aluminates, corresponding to $v=t=u=0$ in formula I, the lanthanide and magnesium deficit is compensated by a aluminium excess. Particular examples of aluminates corresponding to formula (d) and produced in the form of monocrystals are as follows:

$(La_{0.95}Pr_{0.05})_{0.9}Mg_{0.5}Al_{11.433}O_{19}$ $(La_{0.90}Nd_{0.10})_{0.7}Mg_{0.8}Al_{11.433}O_{19}$ $(La_{0.90}Nd_{0.10})_{0.9}Mg_{0.5}Al_{11.433}O_{19}$.

The last compound has an optimum composition. It was obtained by the Zcochralski method from a bath having a composition very close to that of the monocrystal. Thus, this aluminate has a so-called congruent melting. It is also perfectly adapted to producing a continuous power laser emitting at 1054, 1082 or 1320 nm.

Other aluminate monocrystals according to the invention having the laser effect and complying with formula (e) $(La_{1-x}Tr_x)_{1-y}MgAl_{11}O_{19-3v/2}$ with in particular Tr representing neodymium were produced. In these aluminates, corresponding to $y=z=t=u=0$ in formula I, the lanthanide deficit is compensated by the presence of oxygen vacancies. An example of an aluminate according to formula (e) is $(La_{0.90}Nd_{0.10})_{0.9}MgAl_{11}O_{18.85}$.

Compounds complying with formula (f) $(La_{1-x}Tr_x)_{1-y}MgAl_{11+y}O_{19}$, in which Tr represents in particular neodymium were produced as other aluminate monocrystals having the laser effect. In these compounds, corresponding to $v=z=t=u=0$ in formula I, the lanthanide deficit is compensated by an aluminium excess. Aluminates according to the formula (f) are represented by the compound $(La_{0.90}Nd_{0.10})_{0.85}MgAl_{11.15}O_{19}$.

Monocrystals were also produced having laser properties and complying with formula (g) $La_{1-x}Tr_x MgAl_{11}O_{19}$ in which Tr represents the divalent europium-praseodymium pair or the divalent europium-neodymium pair with retention of the electrical neutrality by adding oxygen vacancies equal to $\frac{1}{2}[Eu^{2+}]$. The following are examples of aluminates compying with formula (g)

$La_{0.95}Pr_{0.095}Eu^{2+}_{0.005}MgAl_{11}O_{18.0075}$ and $La_{0.90}Nd_{0.095}Eu^{2+}_{0.005}MgAl_{11}O_{18.9975}$.

In all the aluminates corresponding to formulas a, b, c, d, e, f or g and which contain neodymium, it is possible to substitute part of the aluminium by chromium, in order to increase the efficiency of the laser effect of the corresponding aluminates.

In the same way, in the aluminates complying with formulas a, c, d or f, it is possible to substitute part of the laser activator (Pr, Nd) by $Eu^{2+}$, whilst retaining the electrical neutrality, by adding aluminium or oxygen vacancy.

Examples of aluminates containing chromium as the laser sensitizer and complying with formula I are:

$(La_{0.90}Ce_{0.005}Nd_{0.095})_{0.9}Mg_{0.5}Al_{11.383}Cr_{0.05}O_{19}$ and $(La_{0.90}Nd_{0.10})_{0.9}Mg_{0.5}Al_{11.383}Cr_{0.05}O_{19}$.

The latter compound has an optimum composition having a so-called congruent melting. This material can be produced in the form of large monocrystals by the Czochralski method and can advantageously be used as a laser emitter in a continuous power laser emitting at 1054, 1083 or 1320 nm.

In addition, aluminate monocrystals according to the invention were produced only containing lanthanum as lanthanides, the laser effect then being due to the chromium present in the aluminate. An example of an aluminate only containing lanthanum as the lanthanide is that of formula:

$La_{0.9}Mg_{0.5}Al_{11.383}Cr_{0.05}O_{19}$.

This compound has the advantage of having congruent melting and can therefore be produced in the form of large monocrystals.

As the laser emission of this aluminate is due to the chromium, it can be used as a laser emitter emitting in the visible range between 680 and 800 nm. In view of the wide emission band of chromium, such a compound can be advantageously used in a wavelength-tunable power laser operating in continuous or pulsed manner.

FIG. 1 diagrammatically shows a continuous power laser using an aluminate monocrystal according to the invention. This laser comprises a laser cavity 2 containing an aluminate rod or bar 4 according to the invention arranged perpendicularly to the longitudinal axis 3 of the laser. This aluminate rod 4 e.g. is of formula:

$(La_{0.90}Nd_{0.10})_{0.9}Mg_{0.5}Al_{11.433}O_{19}$ or the formula $(La_{0.90}Nd_{0.10})_{0.9}Mg_{0.5}Al_{11.383}Cr_{0.05}O_{19}$ emitting in the infrared.

A monochromatic light source 6, such as an ionized crypton or argon laser, makes it possible to irradiate the aluminate rod 4, via a convergent lens 7, in order to ensure the optical pumping of rod 4. Laser cavity 2 also comprises a convergent lens 8 transforming the light emitted by aluminate bar 4 into a parallel light beam, which is directed onto an exit mirror 10. Following reflection on the latter, the light beam again passes through the convergent lens 8 and the amplifier medium or aluminate rod 4. The amplified laser beam is then reflected by a dichroic entrance mirror 12, in the vicinity of which rod 4 is positioned, said mirror 12 being transparent to the light emitted by monochromatic source 6 and opaque to that emitted by aluminate monocrystal 4.

The laser beam, which has been adequately amplified in cavity 10, is then passed outside the laser, via mirror 10, which is partly transparent to the light emitted by aluminate monocrystal 4. The replacement of the neodymium-magnesium aluminate rod 4 by a praseodymium-magnesium aluminate according to the invention, e.g. of formula:

$$(La_{0.95}Pr_{0.05})_{0.9}Mg_{0.5}Al_{11.433}O_{19}$$

leads to a continuous power laser emitting in the visible range and in particular in the yellow and red.

In the same way, it is possible to use an aluminate rod which, in place of neodymium, contains holmium, erbium, thulium, combined or not with cerium, in order to obtain power lasers emitting in a wide wavelength range. In particular, the use of an aluminate containing holmium permits emission of a laser beam, whose wavelength varies from 1.5 to 3 micrometers, as a function of the chosen transition.

Moreover, it is possible to use an aluminate rod only containing lanthanum as the lanthanide and which e.g. is of formula $La_{0.9}Mg_{0.5}Al_{11.383}Cr_{0.05}O_{19}$, with a view to obtaining a continuous power laser, wavelength tunable in a range between 690 and 800 nm.

The wavelength tunability can be obtained with the aid of a wavelength selection system 14 placed between convergent lens 8 and exit mirror 10 of laser cavity 2, which is of the Brewster angle prism type, or an interference filter formed from two birefringent material plates.

Figure 2:
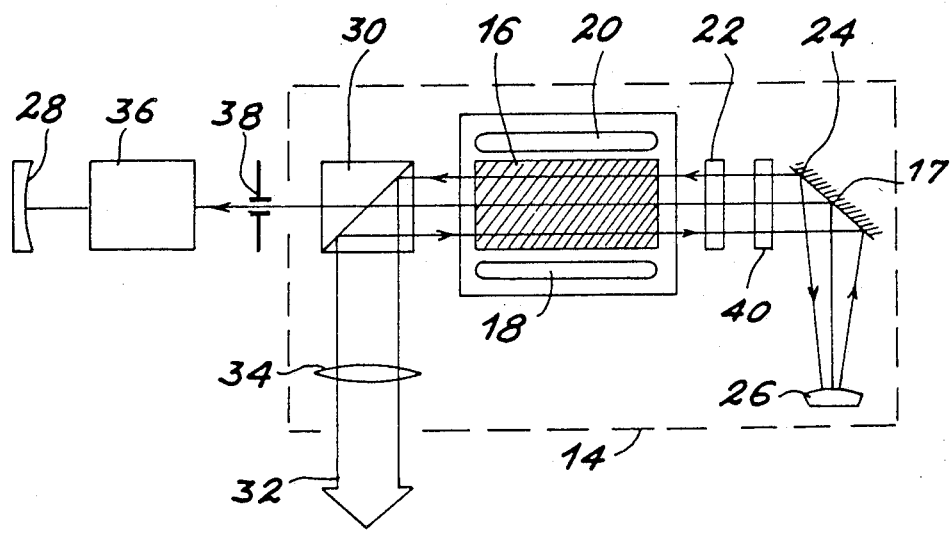
FIG. 2, diagrammatically a pulsed power laser using an aluminate monocrystal according to the invention.

The aluminates according to the invention can also be used in monocrystalline form in a power laser emitting in pulsed manner. To this end, FIG. 2 shows a pulsed power laser emitting in the infrared. This pulsed laser comprises a cavity 14 containing a monocrystalline rod 16 of an aluminate according to the invention arranged parallel to the longitudinal axis 17 of the laser. This aluminate is e.g. of formula: $La_{1-x}Nd_xMg_{1-z}Al_{11+2z/3}O_{19}$ with $0.2 < x < 0.5$ and $0 \leq z \leq 0.55$.

On either side of rod 16 are provided elongated, high intensity, xenon flash lamps 18, 20, oriented in accordance with laser axis 17. These lamps ensure a longitudinal optical pumping of the aluminate rod 16.

Laser cavity 14 also comprises a quarter wave plate 22 transforming the linearly polarized incident light from rod 16 into circularly polarized light. Plate 22 is followed by a plane mirror 24 and a divergent convex mirror 26. Following reflection on mirror 26, the widened light beam, which has been adapted and circularly polarized, again passes through the quarter wave plate 22, thus producing a vertically polarized beam, which completely sweeps the amplifier medium or rod 16, whilst extracting the maximum light energy therefrom.

The amplified laser beam propagating in the direction of another highly reflecting concave mirror 28 is interrupted by a polarizing prism 30 ejecting the vertically polarized beam 32 out of the laser cavity. A convergent lnes 34 makes it possible to obtain a parallel light beam.

This pulsed laser is equipped with an electrooptical switch 36, more particularly referred to as a $Q_1$ switch, positioned between the concave mirror 38 and the exit polarizer 30. When this switch is closed, i.e. a voltage is applied thereto, the laser cannot function. Thus, during "pumping", the amplifier medium with lamps 18, 20, polarizer 30 is transparent to the horizontally polarized photons and permits the passage of light to switch 36. The latter rotates the polarization direction by 90° and prevents the polarizer 30 from transmitting said light. However, on opening the electrooptical switch or $Q_1$ switch 36, the latter no longer alters the horizontal polarization from the polarizer, thus enabling the laser cavity 14 to amplify the light from rod 16.

A diaphragm 38 can be placed between the switch and the polarizer in order to channel the laser light.

As hereinbefore, the neodymium-based rod 16 can be replaced by a rod based on praseodymium, holmium, erbium, thulium, combined with cerium, satisfying the formulas given hereinbefore in order to obtain other pulsed power lasers. It is merely necessary to adapt the coating of mirrors 26 and 28 to the sought laser emission wavelength.

In order to obtain a wavelength-tunable laser, e.g. by using an aluminate according to the invention containing chromium as the laser activator, a wavelength selection device 40, like that described hereinbefore, can be positioned between plate 22 and mirror 24.

The lasers given hereinbefore are clearly only for illustration purposes and other types of laser can be equipped with a monocrystal of an aluminate according to the invention and complying with formula I.

The monocrystals of aluminates according to the invention in which Tr represents neodymium can be used in all applications which at present use a YAG-type laser emitter. In particular, these monocrystals can be used for lasers to be used in cutting or marking material, as well as for producing welds. The cutting of material is ensured by e.g. placing a neodymium-activated monocrystalline aluminate in the cavity of a laser, as described hereinbefore, by orienting and then focusing on the surface of the material the light from the laser, so as to locally bring said material to its melting point and thus ensure the cutting thereof as is moves in the laser beam. Apart from YAG-type applications, the aluminates according to the invention containing neodymium also have special applications.

In particular, a neodymium-based monocrystal according to the invention can be placed in the cavity of a laser equipped with a selective filter making it possible to tune the wavelength of the light emitted around 1.082 micrometers. This light can then be used for polarizing the atoms of a gas (e.g. helium III or IV).

In the field of thermonuclear fusion, this polarization of helium II or IV can be used for considerably increasing the probability of the fusion reaction of D-$^3$e.

A monocrystal of a neodymium-based aluminate according to the invention, at its normal emission wavelength of 1.054 micrometers, can be advantageously used as an oscillator in a laser chain with neodymium-activated fluophosphate or phosphate glass rods in order to trigger the thermonuclear fusion reaction.

In the field of partical acceleration, the polarization of the atoms of a gas, such as helium, can be used for producing beams of polarized ions used in partical accelerators.

In the field of magnetometry and gyrometry, the use of a power laser containing a neodymium-based monocrystalline aluminate according to the invention makes it possible to improve the performance characteristics of existing optical pumping gyroscopes or magnetometers, particularly with regards to the consumption, life and handling thereof. In this particular case, the laser emitters according to the invention can also lead to the development of new magnetometric or gyroscopic devices.

A particular application of the chromium-activated aluminate according to the invention will be given hereinafter. A monocrystal of this aluminate is placed in a laser cavity having a dispersive element (such as a prism or lattice) making it possible to continuously tune the wavelength between 680 and 800 nm. This device can be used in the detection of certain elements in the earth's atmosphere. For this purpose, the wavelength must be chosen in such a way that it corresponds to the absorption band of the species to be detected. The attenuation of the laser echo from the obstacle is a function of the quantity and nature of the species contained in the atmosphere and this can e.g. be used for remote meteorology.

What is claimed is:

1. A laser comprising a laser emitter monocrystal of a mixed lanthanide-magnesium aluminate of the formula: $(La_{1-x}Tr_x)_{1-y-v}Mg_{1-z-t}Al_{11-u+y+2z/3-}Cr_uO_{19-t-3v/2}$ in which Tr represents; at least one single trivalent substance selected from the group consisting of; yttrium, scandium, and lanthanides other than lanthanum except when u is $\neq 0$ and at least one pair of lanthanides other than lanthanum except when u is $\neq 0$ formed from a divalent element and a trivalent element, said pair of lanthanides retaining their electrical neutrality by adding aluminum or oxygen deficiencies, and any combination of said single trivalent substance and lanthanide pairs; x represents a number such that $0 \leq x < 1$; y and v represent numbers such that $0 \leq y+v \leq 0.4$; z and t represent numbers such that $0 \leq z+t < 1$, and that when $y+v=0$, $z+t \neq 0$, provided that when $z+t=0$, $y+v$ is $\neq 0$ for Tr representing a single trivalent lanthanide; u represents a number from 0 to 2, provided that when Tr represents $y^{3+}$ or $Sc^{3+}$, u is $\neq 0$, that when $x=0$, u is $\neq 0$ and that when $u=0$, x is $\neq 0$, said aluminate being a monophase and having a magnetoplumbite type structure.

2. A laser according to claim 1, wherein x is $\neq 0$ and Tr is selected from the group consisting of neodymium, praseodymium, erbium, holmium, thulium, divalent europium-neodymium pairs, divalent europium-praseodymium pairs and the pairs cerium-neodymium, cerium-praseodymium, praseodymium-samarium, praseodymium-dysprosium, praseodymium-thulium, cerium-erbium and cerium-holmium.

3. A laser emitting in the visible range, comprising a monocrystal of a mixed aluminate as in claim 2 wherein Tr, at least in part, represents praseodymium.

4. A laser emitting in the infrared, comprising a monocrystal of a mixed aluminate according to claim 2, wherein Tr represents, at least in part, neodymium, holmium or erbium.

5. A laser according to claim 1, wherein Tr represents neodymium and x is from 0.2 to 0.5.

6. A laser according to claim 1, wherein Tr represents neodymium and x is about 0.1.

7. A laser according to claim 1, wherein the aluminate is of formula; $(La_{0.90}Nd_{0.10})_{0.9}Mg_{0.5}Al_{11.433}O_{19}$.

8. A laser according to claim 1, wherein the aluminate is of formula: $(La_{0.90}Nd_{0.10})_{0.9}Mg_{0.5}Al_{11.383}Cr_{0.05}O_{19}$.

9. A laser according to claim 1, wherein the aluminate is of formula: $(La_{0.90}Ce_{0.005}Nd_{0.095})_{0.9}Mg_{0.5}Al_{11.383}Cr_{0.05}O_{19}$.

10. A laser according to claim 1, wherein the aluminate is of formula: $La_{0.9}Mg_{0.5}Al_{11.383}Cr_{0.05}O_{19}$.

11. A tunable laser comprising means for tuning a laser at between 680 and 800 nm, and a monocrystal of a mixed aluminate as in claim 9.

12. A tunable laser comprising means for tuning a laser at between 680 and 800 nm, and a monocrystal of a mixed aluminate as in claim 1 wherein $x=0$.

* * * * *